US007064599B1

(12) United States Patent
Taft et al.

(10) Patent No.: US 7,064,599 B1
(45) Date of Patent: Jun. 20, 2006

(54) APPARATUS AND METHOD FOR SIGNAL TRANSMISSION

(75) Inventors: Robert Callaghan Taft, Munich (DE); Maria Rosaria Tursi, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/717,284

(22) Filed: Nov. 19, 2003

(51) Int. Cl.
*H03K 17/16* (2006.01)

(52) U.S. Cl. .................. 327/390; 327/391; 326/113

(58) Field of Classification Search ................ 327/541, 327/539, 540, 391, 403, 404; 326/113
See application file for complete search history.

(56) References Cited

U.S. PATENT DOCUMENTS

| 5,258,662 | A | * | 11/1993 | Skovmand | 327/544 |
| 5,821,697 | A | * | 10/1998 | Weber | 315/200 A |
| 6,118,326 | A | * | 9/2000 | Singer et al. | 327/390 |
| 6,373,324 | B1 | * | 4/2002 | Li et al. | 327/536 |
| 6,404,237 | B1 | * | 6/2002 | Mathew et al. | 326/113 |
| 6,469,573 | B1 | * | 10/2002 | Kanda et al. | 327/541 |
| 6,713,993 | B1 | * | 3/2004 | Descombes | 323/273 |

OTHER PUBLICATIONS

Taft et al., "A 100-MS/s 8-b CMOS Subranging ADC with Sustained Parametric Performance from 3.8V Down to 2.2V", *IEEE Journal of Solid-State Circuits*, Mar. 2001, pp. 331-338, vol. 36 No. 3.
Pan et al., "A 3.3V, 12b 50MSample/s A/D Converter in 0.6 um CMOS with over 80dB SFDR", *2000 IEEE Journal of Solid-State Circuits Conference*, Feb. 7, 2000, pp. 40-41, Session 2.
Song, "Design of Nyquist-Rate ADC", Slide Show, Oct. 10, 2003, pp. 1, 22 and 24.

* cited by examiner

*Primary Examiner*—Tuan T. Lam
*Assistant Examiner*—Hiep Nguyen
(74) *Attorney, Agent, or Firm*—Darby & Darby PC; Matthew M. Gaffney

(57) ABSTRACT

A signal transmission gate includes a switch such as a transistor. The switch includes a gate terminal adapted to receive a control voltage, and a source terminal and a drain terminal. One of the source and drain terminals is adapted to receive an input signal, and the output signal is provided on the other terminal. A constant-voltage boosting circuit generates the control voltage such that it has a substantially constant value above a voltage of the input signal. In one embodiment, the constant-voltage boosting circuit is coupled between the gate terminal and the terminal that receives the input voltage, and generates a substantially constant voltage difference. In one implementation, a component is employed that exhibits a characteristic voltage behavior, such as a diode, for generating the substantially constant voltage difference.

19 Claims, 7 Drawing Sheets

| $V_{GN}$ | $V_{GP}$ | GATE 100 | $V_{IN}$ | $V_{OUT}$ |
|---|---|---|---|---|
| $V_{DD}$ | GND | ON | $GND \lesssim V_{IN} \lesssim V_{DD}$ | $\sim V_{IN}$ |
| GND | $V_{DD}$ | OFF | $GND \lesssim V_{IN} \lesssim V_{DD}$ | UNDEFINED |

$V_{GN} = V_{IN} + V_{CV}$

APPARATUS AND METHOD FOR SIGNAL TRANSMISSION

FIELD OF THE INVENTION

The present invention is related to the field of electronic devices, and more specifically to devices and circuits configured as signal transmission gates and methods for transmitting signals.

BACKGROUND

In electronic circuits, certain classes of signals often have a voltage or a current whose value encodes information. The information can be a measured value of a quantity, a number, etc.

Such signals are used within the circuit for processing the encoded information. Processing, however, attenuates the strength of such signals, which renders them less reliable for further processing.

Transmission gates are electronic circuits that are used to control when such signals are to be transmitted within the circuit. Transmission gates receive the signal as an input, and generate the restored signal as an output, when it is desired. In so doing, a transmission gate restores such signals to their original strength, so that they can be used for further processing.

BRIEF DESCRIPTION OF THE DRAWINGS

The invention will become more readily apparent from the Detailed Description, which proceeds with reference to the drawings, in which.

DETAILED DESCRIPTION

Figures 1, 2:
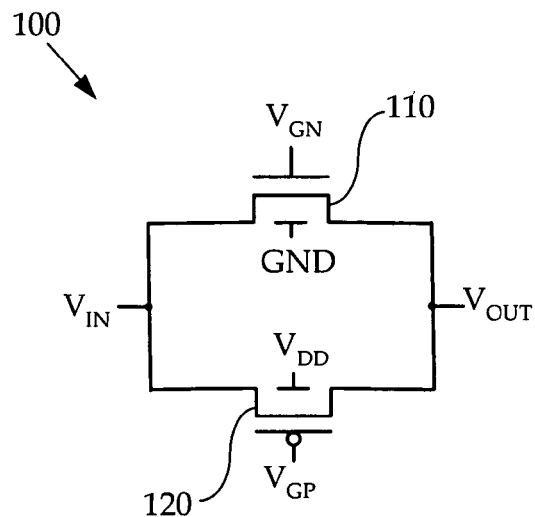
FIG. 1 is a schematic diagram of a transmission gate.
FIG. 2 is a table of values for illustrating an operation of the circuit of FIG. 1.

The present invention is now described. While it is disclosed in its preferred form, the specific embodiments of the invention as disclosed herein and illustrated in the drawings are not to be considered in a limiting sense. Rather, these embodiments are provided so that this disclosure will be thorough and complete, and will fully convey the scope of the invention to those skilled in the art. Indeed, it should be readily apparent in view of the present description that the invention may be modified in numerous ways. Among other things, the present invention may be embodied as devices, methods, and so on. Accordingly, the present invention may take the form of an entirely hardware embodiment, an entirely method embodiment or an embodiment combining method and hardware aspects. The following detailed description is, therefore, not to be taken in a limiting sense.

Throughout the specification, the meaning of "a," "an," and "the" may also include plural references. The meaning of "in" includes "in" and "on."

Generally, the invention is directed to signal transmission gates, and methods of transmitting signals. The invention is advantageously applied for digital and analog signals. Briefly, a signal transmission gate includes a switch such as a transistor. The switch includes a gate terminal adapted to receive a control voltage, and a source terminal and a drain terminal. One of the source and drain terminals is adapted to receive an input signal, and the output signal is produced on the other terminal. A constant-voltage boosting circuit generates the control voltage such that it has a substantially constant value above a voltage of the input signal. In one embodiment, the constant-voltage boosting circuit is coupled between the source terminal and the gate terminal, and generates a substantially constant voltage difference. In one implementation, a component is employed that exhibits a characteristic voltage behavior, such as a diode, for generating the substantially constant voltage difference.

FIG. 1 is a schematic of transmission gate 100. Gate 100 is made from NMOS transistor 110 and PMOS transistor 120, coupled in parallel with joined terminals as shown. Transistors 110 and 120 are controlled respectively by voltages $V_{GN}$, $V_{GP}$, which are applied to their gates. Output signal $V_{OUT}$ is generated in response to receiving input signal $V_{IN}$.

FIG. 2 is a table showing an example of how gate 100 of FIG. 1 may be controlled by individually controlling transistors 110 and 120. For the examples of FIG. 2, voltages $V_{GN}$ and $V_{GP}$ are the logical inverse of each other. In other words, when one of them is zero ("ground", or "GND"), the other one is placed at the full value of a supply voltage $V_{DD}$.

As can be seen in FIG. 2, gate 100 may be turned on for a signal transmission operation. This way, the generated output voltage $V_{OUT}$ equals substantially input voltage $V_{IN}$. Alternately, gate 100 may be turned off. In that instance, there is no output signal being generated, regardless of the value of input voltage $V_{IN}$.

In gate 100, when input voltage $V_{IN}$ is near the value of supply voltage $V_{DD}$, NMOS transistor 110 does not conduct. And when input voltage $V_{IN}$ is near GND, it is PMOS transistor 120 that does not conduct.

A challenge is that, when gate 100 is turned on, output voltage $V_{OUT}$ does not equal input voltage $V_{IN}$ for values of $V_{IN}$ that are about midrange between GND and $V_{DD}$, because of the higher on resistance at that range, which results from the fact that neither transistor is fully turned on. In other words, there is reduced signal integrity in the midrange. That occurs because the gate-to-source potential $V_{GS}$ needs to be larger than a threshold voltage of a corresponding transistor. While this occurs in the ends of the range for at least one of transistors 110, 120, it occurs for neither in the midrange.

Further, there are constraints in the size of transistors 110, 120. Making them larger reduces the on-resistance, but beyond some point their parasitic capacitance becomes too large.

Figure 3:
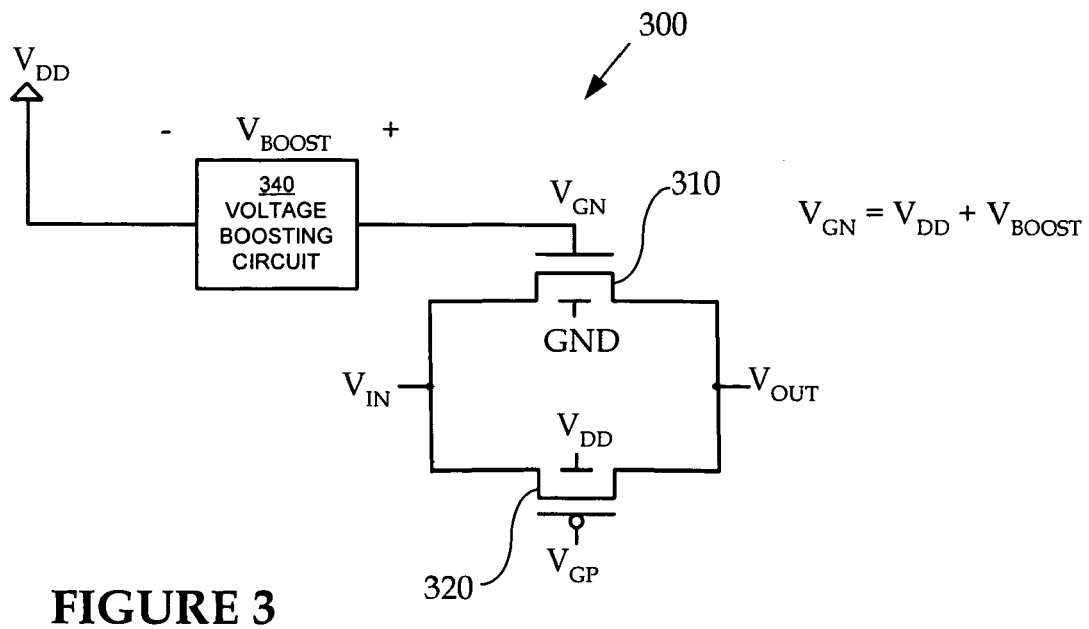
FIG. 3 is a schematic diagram of another transmission gate.

FIG. 3 is a schematic of transmission gate 300. Gate 300 is made from NMOS transistor 310 and PMOS transistor 320, coupled similarly as transistors 110, 120 of gate 100 respectively. In addition, voltage boosting circuit 340 is coupled between supply voltage $V_{DD}$ and the gate of NMOS transistor 310.

Circuit 340 generates a voltage difference $V_{BOOST}$, and may be implemented by a circuit such as a charge pump and/or a capacitor. The value of $V_{BOOST}$ may be constant with time, and in any way does not adapt when the value of input voltage $V_{IN}$ changes. Circuit 340 has the effect of increasing voltage $V_{GN}$ applied to the gate of NMOS transistor 310 above supply voltage $V_{DD}$. The increase is by an amount $V_{BOOST}$. In other words, $V_{GN}$ substantially equals $V_{DD}+V_{BOOST}$. This lowers the on resistance of NMOS transistor 310, at the expense of an increased gate-to-source voltage when input voltage $V_{IN}$ is close to GND.

In the application of FIG. 3, a boosting voltage was applied to NMOS transistor 310, but not to PMOS transistor 320. Transmission gate 300 may be further implemented by applying a boost to PMOS transistor 320, such as a negative boost.

Figure 4:
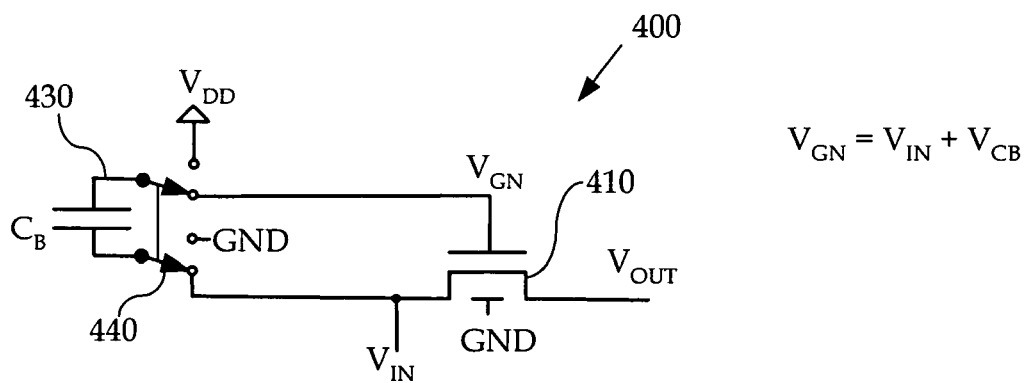
FIG. 4 is a schematic diagram of yet another transmission gate.

FIG. 4 is a schematic of transmission gate 400 that uses NMOS transistor 410. Further, capacitor $C_B$ 430 is coupled to switch 440.

In terms of operation, when switch 440 is in an OFF position, capacitor $C_B$ 430 is charged to a large value, such as that of supply voltage $V_{DD}$, or other value. When switch 440 is in an ON position, capacitor $C_B$ 430 maintains the gate of NMOS transistor 410 at a value $V_{GN}$ that is higher than that of input voltage $V_{IN}$ by the capacitor voltage $V_{CB}$.

Figure 5:
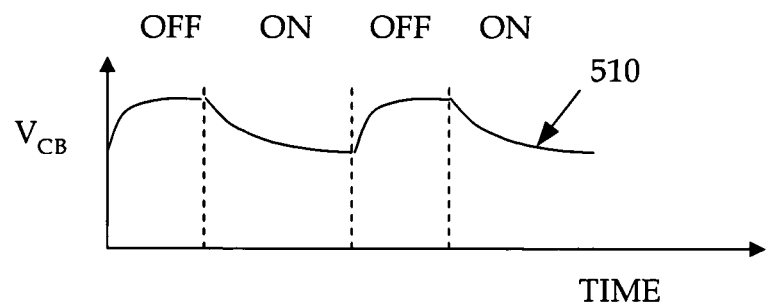
FIG. 5 is a timing diagram illustrating a time variation in the voltage of a capacitor in FIG. 4.

FIG. 5 is a timing diagram showing graphed evolution 510 of capacitor voltage $V_{CB}$. It is not constant with time; as time passes, capacitor $C_B$ 430 discharges, and its voltage decreases due to leakage. Because of the leakage, gate 400 must be switched off regularly, to recharge capacitor $C_B$ from supply voltage $V_{DD}$. Accordingly, the arrangement works when gate 400 is switched off and back on repeatedly.

For gates 300 and 400, an overdrive voltage may occur at the gates of NMOS transistors 310, 410 respectively. The overdrive voltage is the value of gate voltage $V_{GN}$, which is above the value of supply voltage $V_{DD}$. The overdrive voltage needs to be larger than threshold voltage $V_{TH}$, for NMOS transistors 310, 410 to pass substantially all input signal levels. This overdrive voltage, however, can produce stress in the materials, which may damage the device. In the case of gate 300, some overdrive voltage is applied continuously by circuit 340, albeit by a controlled amount $V_{BOOST}$. In the case of gate 400, an overdrive voltage is applied intermittently, depending on input voltage $V_{IN}$. But when the latter approaches a value of supply voltage $V_{DD}$, the overdrive voltage itself can be as high as $V_{DD}$.

Figure 6:
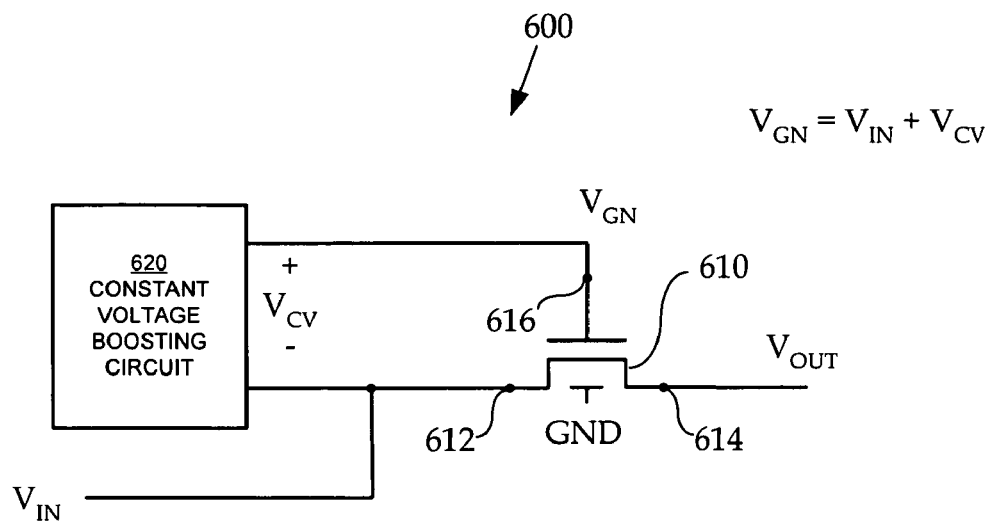
FIG. 6 is a schematic diagram illustrating a signal transmission gate according to an embodiment of the invention.

FIG. 6 illustrates transmission circuit 600 made according to the invention, which may also be called a transmission gate. Circuit 600 includes input node 612 for receiving input signal $V_{IN}$, and output node 614 for generating output signal $V_{OUT}$ from input signal $V_{IN}$. Input signal $V_{IN}$ is therefore transmitted through circuit 600. Transmission switch 610 is coupled between input node 612 and output node 614. Transmission switch 610 further has control terminal 616, on which a control voltage $V_{GN}$ is applied. Transmission switch 610 is controlled by the control voltage.

Transmission switch 610 may be implemented in any number of ways. One such way is, as shown in FIG. 6, with a switched device such as an NMOS transistor, which is also known as a main transistor. Switch 610 includes a gate terminal coupled to control terminal 616, and adapted to receive control voltage $V_{GN}$. The switch also includes a source terminal and a drain terminal. One of them is coupled with input node 612, and is adapted to receive input signal $V_{IN}$. The other one is coupled with output node 614, and adapted to produce on it output signal $V_{OUT}$.

Since switch 610 is an NMOS, the source terminal may be coupled with input node 612, and the drain terminal may be coupled with output node 614, as would be conventional. If switch 610 instead were a PMOS, then the boost voltage would have to be negative in the ON condition.

In circuit 600, constant-voltage boosting circuit 620 maintains the control voltage $V_{GN}$ at a substantially constant value above a voltage of the input signal $V_{IN}$. In other words, control voltage $V_{GN}$ varies, but it does that in substantial unison with input signal $V_{IN}$.

Boosting circuit 620 may be implemented in any number of ways. In the embodiment of FIG. 6, boosting circuit 620 is coupled between input node 612 and gate terminal 616. Further, it generates boosted voltage $V_{CV}$, and maintains it substantially constant. This way, control voltage $V_{GN}$ is maintained at a value substantially equal to the voltage of input signal $V_{IN}$ plus that of boosted voltage $V_{CV}$.

Figure 7:
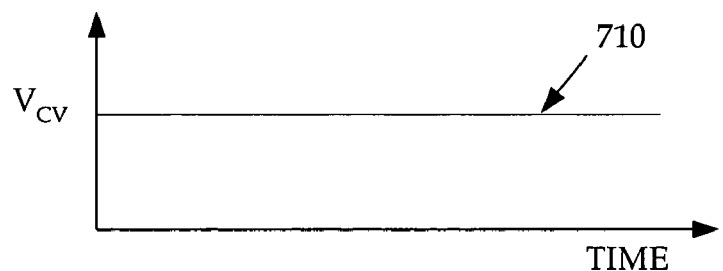
FIG. 7 is a timing diagram illustrating that a substantially constant voltage above an input voltage is applied at the gate of a switch is in the diagram of FIG. 6.

FIG. 7 is a timing diagram showing graphed evolution 710 for boosted voltage $V_{CV}$. As can be seen, boosted voltage $V_{CV}$ remains substantially constant, and is applied substantially constantly. Further the invention accomplishes this without requiring gate 610 to be switched on and off, as was seen in FIG. 5 for the operation of gate 400 of FIG. 4.

Evolution 710 remains substantially constant at least for a constant input signal $V_{IN}$. As will be seen later, it may change based on the level of input signal $V_{IN}$ due to a body effect that affects a threshold voltage $V_{TH}$, and further the body effect may be compensated.

Returning to FIG. 6, in some embodiments of the invention transmission switch 610 exhibits a characteristic behavior, which changes depending on a value of input signal $V_{IN}$. For example, in FIG. 6 transmission switch 610 includes a main NMOS transistor. The characteristic behavior can be that a threshold voltage of the main NMOS transistor changes depending on the input signal value. In that case, graph 710 in FIG. 7 should be interpreted as being substantially constant for a constant input signal $V_{IN}$.

In some of these embodiments, constant-voltage boosting circuit 620 maintains the control voltage at a value above the input signal voltage that is further adjusted. Adjustment is so as to substantially compensate for the characteristic behavior of the transmission switch. An example of that will be described later in this document, with respect to FIG. 9.

It will be appreciated that transmission gate 600 of FIG. 6 is able to operate continuously, while resulting in reduced overdrive voltage stress. Indeed such occurs, but not at the critical junctions, i.e. between any two of the gate, source and drain. Moreover, transmission gate 600 may advantageously be implemented with a relatively small transistor component size, which can reduce parasitic capacitances. This enables gate 600 to allow to pass signals that are changing very quickly, e.g. at 1.6 GHz and higher. Further, since the transistor component size can be relatively small, the leakage current can also be relatively small if transmission gate 600 is OFF. And if it is ON, the resistance can be both low and relatively stable, which can yield high output signal integrity, even at that high speed.

One embodiment of boosting circuit 620 includes a component exhibiting a characteristic voltage behavior. The component may be, for example, a diode, a MOS transistor, a MOS transistor configured as a diode, etc. The component may include a junction between two dissimilar materials, in which case the characteristic voltage behavior is a voltage drop obtained across the junction upon energizing it. This characteristic voltage behavior may be advantageously exploited according to the invention, for generating a $V_{CV}$ as substantially constant with time as is shown in FIG. 7.

Figure 8:
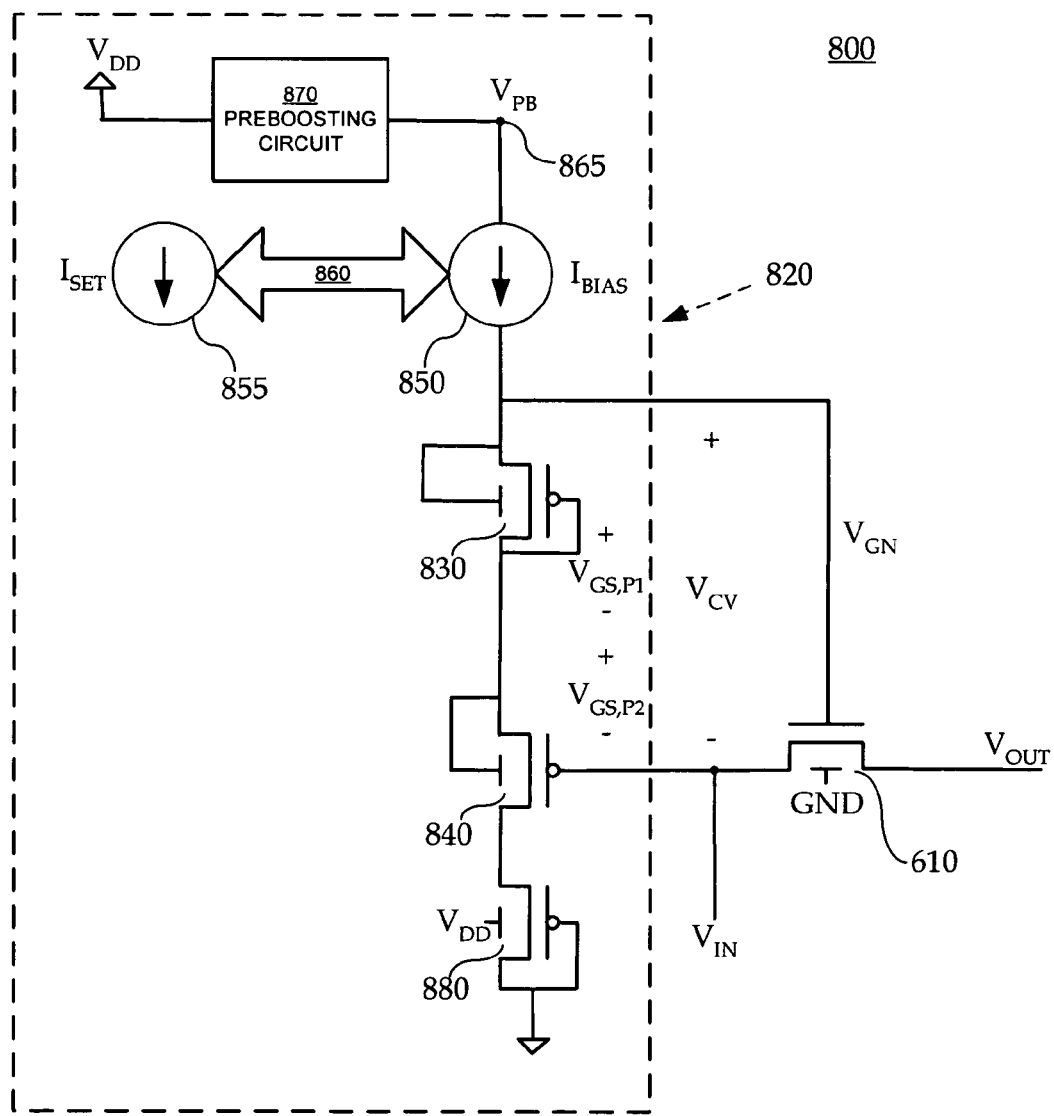
FIG. 8 is a schematic diagram illustrating an embodiment of a constant-voltage boosting circuit for the gate of FIG. 6.

FIG. 8 is a schematic of exemplary circuit 800 that includes transmission switch 610 previously described with reference to FIG. 6. Constant-voltage boosting circuit 820 is one of many possible embodiments of implementing boosting circuit 620 of FIG. 6.

In the embodiment shown in FIG. 8, boosting circuit 820 includes PMOS transistor 830 and PMOS transistor 840, which are sometimes called control transistors. Control PMOS transistor 840 has a gate coupled to receive input signal $V_{IN}$. Transistor 830 exhibits a characteristic voltage drop $V_{GS,P1}$, while transistor 840 exhibits a characteristic voltage drop $V_{GS,P2}$. Together, these characteristic voltage drops $V_{GS,P1}$, $V_{GS,P2}$ are combined to maintain the voltage difference of boosted voltage $V_{CV}$ at a substantially constant level, as per the invention.

Furthermore, the connection of PMOS transistor 840 allows input signal $V_{IN}$ to set the $V_{GS}$ of transmission switch 610, without adding a DC load on input signal $V_{IN}$. Note that this is accomplished in a simple fashion, which avoids the use of an amplifier. This renders the present invention able to work concurrently at low power and with high bandwidth.

First current source 850 is adapted to drive a bias current $I_{BIAS}$ through transistors 830, 840 to energize them. This generates the characteristic voltage drops $V_{GS,P1}$, $V_{GS,P2}$, and thus also boosted voltage $V_{CV}$. Second current source 855 and current mirror 860 control first current source 850. Current mirror 860 thus forces the bias current $I_{BIAS}$ of current source 850 to be set according to a current $I_{SET}$ of second current source 855. As a design point, then, $I_{SET}$ is set to control the desired value of $I_{BIAS}$.

It is preferred that transistor 880 be provided, configured as a diode and coupled to ground for draining the current of current source 850. Transistor 880 has a voltage drop, and thus prevents the application of too high a voltage across the source and drain of transistor 840.

Preboosting node 865 is maintained at a voltage $V_{PB}$, which may be maintained constant. Preboosting circuit 870 boosts voltage $V_{PB}$ of preboosting node 865. For example, preboosting circuit 870 may be coupled to a supply voltage $V_{DD}$, and thus raise voltage $V_{PB}$ above the value of supply voltage $V_{DD}$. Preboosting circuit 870 may be made in any way known in the art. For example, it may be made by a charge pump.

In the embodiment of FIG. 8, there is at least one electrical component between preboosting node 865 and the control terminal of transmission switch 610. In this instance, this electrical component is current source 850. This ensures that control voltage $V_{GN}$ does not reach unnecessarily high values, and eases the task of regulating the voltage difference of boosted voltage $V_{CV}$.

As also described above, in some embodiments of the invention, the constant-voltage boosting circuit further adjusts the control voltage depending on the value of input signal $V_{IN}$, to allow for the fact that the threshold voltage itself may change depending on the value of input signal $V_{IN}$. An example of that is described below.

Figure 9:
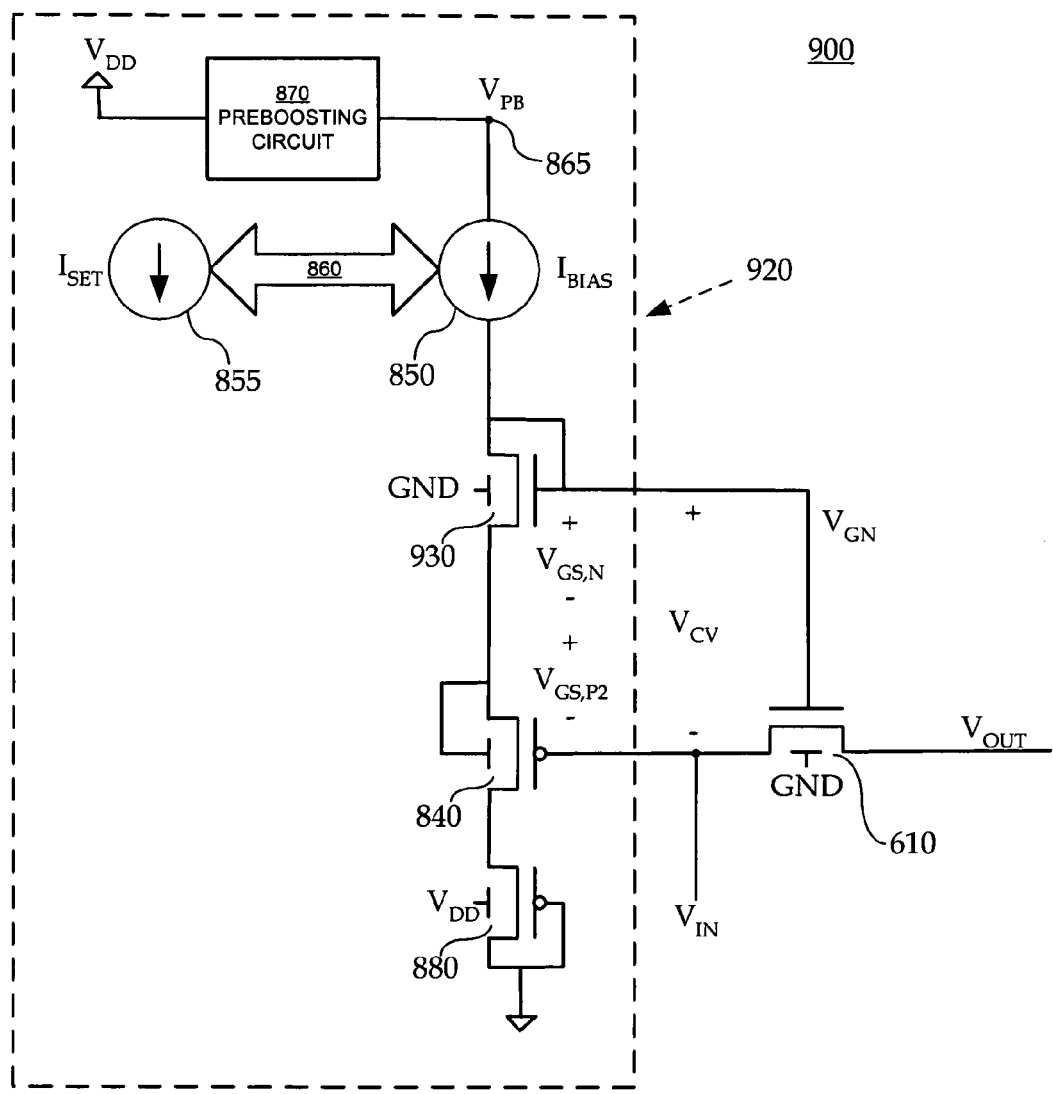
FIG. 9 is a schematic diagram of the circuit of FIG. 8, as further modified to correct also for threshold voltage variation based on an input signal value.

FIG. 9 is a schematic of circuit 900 that is largely similar to circuit 800 of FIG. 8. The difference is found in that constant-voltage boosting circuit 920 is somewhat different from constant-voltage boosting circuit 820. The difference is that NMOS control transistor 930 is provided, instead of PMOS control transistor 830. Transistor 930 exhibits a characteristic voltage drop $V_{GS,N}$. Together with voltage drop $V_{GS,P2}$ of transistor 840, these characteristic voltage drops are combined to generate a boosted voltage $V_{CV}$.

Boosted voltage $V_{CV}$ remains substantially constant, as per the invention, except it changes somewhat depending on the value of input signal $V_{IN}$. Regardless, control NMOS transistor 930 is arranged so that a behavior of its threshold voltage substantially cancels the characteristic behavior of the threshold voltage of transistor 610, as input signal $V_{IN}$ changes. Indeed, as input signal $V_{IN}$ changes, the threshold voltage of transistor 930 changes in substantial unison with the threshold voltage of transistor 610, and the body effect of the two transistors remains the same. As such, constant-voltage boosting circuit 920 further adjusts boosted voltage $V_{CV}$ so as to substantially compensate for the characteristic behavior of transistor 610.

Furthermore, it is preferred that NMOS transistor 930 be provided as a diode as shown, and matches transistor 610. This way the on-resistance varies less over temperature and process.

Figure 10:
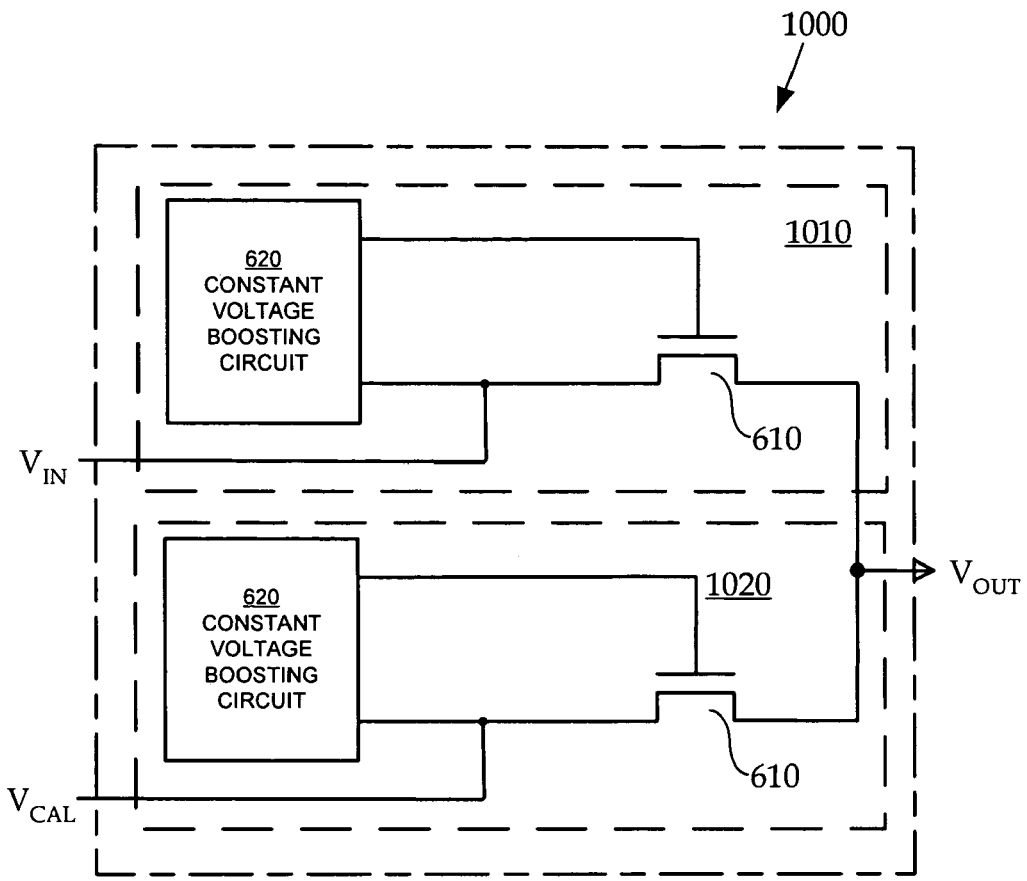
FIG. 10 is a schematic diagram illustrating a multiplexer made from two gates.

FIG. 10 is a schematic of multiplexer 1000 that includes two transmission circuits 1010, 1020. Each transmission circuit 1010, 1020 may be arranged substantially similarly to transmission circuit 600 of FIG. 6. Their output nodes are coupled.

In operation, the input node of transmission circuit 1010 receives input voltage $V_{IN}$. Input voltage $V_{IN}$ may be received from the chip that circuit 1000 is implemented on, or from off-chip. Additionally, the input node of transmission circuit 1020 receives a known calibration voltage $V_{CAL}$. Calibration voltage $V_{CAL}$ may change by stepping through successive voltages, to assist in calibration. In one embodiment, the successive voltages differ by a fixed amount.

Transmission circuit 1010 may be turned off, while transmission circuit 1020 may be used for calibration. Then transmission circuit 1020 may be turned off, while transmission circuit 1010 may be used for transmitting signals with high integrity and low leakage current.

Figure 11:
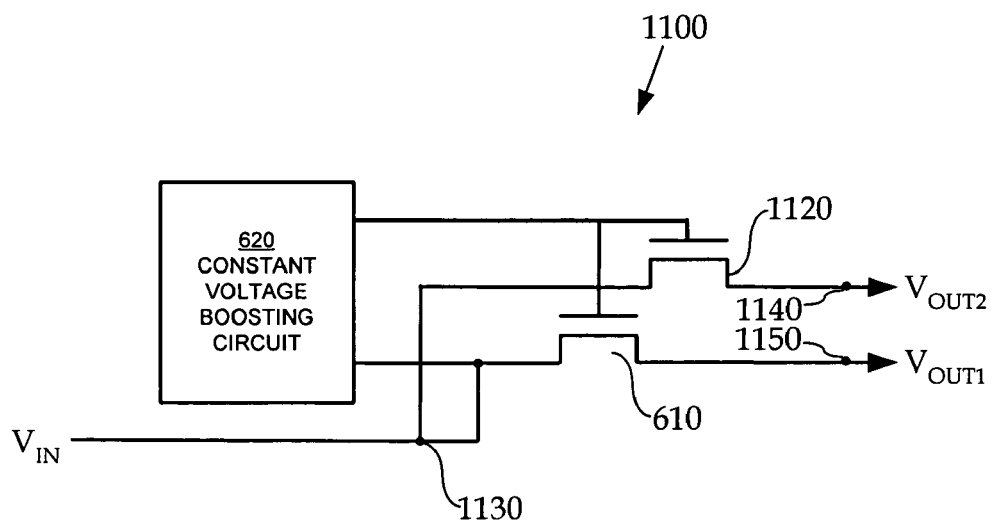
FIG. 11 is a diagram illustrating one more transmission gate.

FIG. 11 is a schematic diagram of exemplary transmission circuit 1100 that includes components arranged in substantially the same manner as those components shown in circuit 600. For example, transmission switch 610 and constant-voltage boosting circuit 620 are arranged to produce a first output voltage $V_{OUT1}$ at output node 1140. In addition, second transmission switch 1120 is coupled between input node 1130 and second output node 1150. Second output voltage $V_{OUT2}$ is produced at second output node 1150.

A single transmission circuit 1100 can be used to output a number of calibration voltages, of the type of calibration voltages received by circuit 1020 of FIG. 10. The arrangement of FIG. 11 can improve noise isolation between different output channels.

Figure 12:
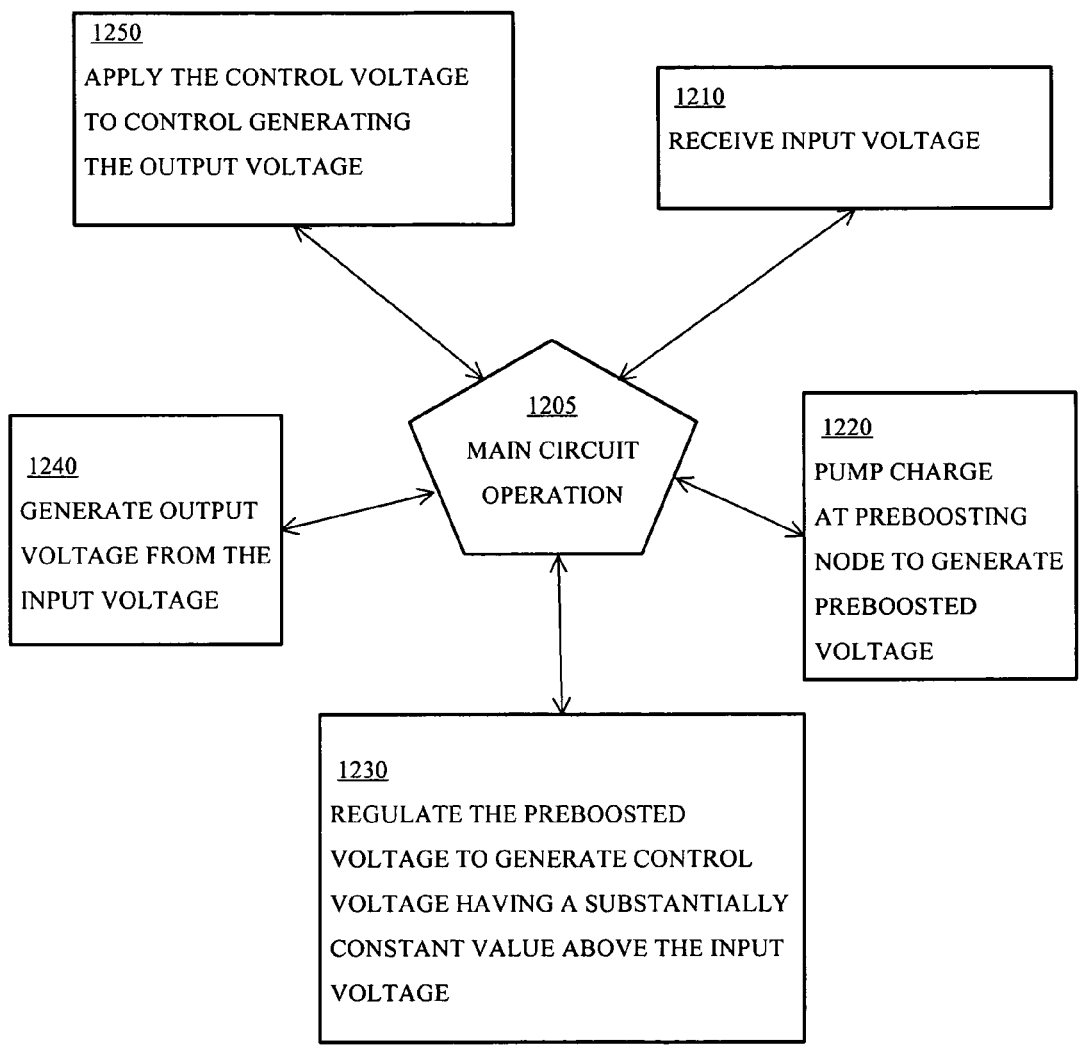
FIG. 12 is a block diagram illustrating a method according to the invention.

Referring now to FIG. 12, block diagram 1200 illustrates a method according to an embodiment of the invention. The method of diagram 1200 may also be practiced by different embodiments, including but not limited to circuit 600 of FIG. 6, circuit 1000 of FIG. 10, and circuit 1100 of FIG. 11.

At block 1205, the process of the main operation of a transmission circuit occurs, in connection with other operations at other blocks. An output voltage is generated from an input voltage, as controlled by a control voltage that remains at a substantially fixed level above the input voltage. In some embodiments, the other operations are concurrent and/or optional.

At block 1210, the process receives an input voltage, and provides it at least for the main operation at block 1205. The input voltage may be received at a transmission gate.

Also, at block 1220, the process optionally pumps charge to a preboosting node to generate a preboosted voltage, and optionally provides it at least to the operation of block 1205. Additionally, at block 1230, the preboosted voltage may optionally be regulated. This regulation enables the generation of a control voltage that has a substantially constant value above the input voltage. The process at block 1230 may be performed in cooperation with the process at block 1220.

At block 1240, an output voltage is generated from the input voltage received at block 1210. This is performed, for example, at an output node of a transmission gate. At block 1250, which cooperates with block 1205, the control voltage regulated at block 1230 is applied to control the generating of the output voltage at block 1240.

Numerous details have been set forth in this description, which is to be taken as a whole, to provide a more thorough understanding of the invention. In other instances, well-known features have not been described in detail, so as to not obscure unnecessarily the invention.

The invention includes combinations and subcombinations of the various elements, features, functions and/or properties disclosed herein. The following claims define certain combinations and subcombinations, which are regarded as novel and non-obvious. Additional claims for other combinations and subcombinations of features, functions, elements and/or properties may be presented in this or a related document.

The invention claimed is:

1. A transmission gate, comprising:
    a switch circuit including an input that is coupled to an input node, an output that is coupled to an output node, and a control input that is coupled to a control input node;
    a boost circuit that is arranged to provide a boost voltage at a boost node responsive to a supply voltage;
    a current source circuit that is coupled between the boost node and the control input node, wherein the current source circuit is arranged to provide a bias current during an on condition; and
    a constant voltage difference circuit that is coupled to the control input node, wherein the constant voltage difference circuit is arranged to provide a control input voltage at the control input node such that a voltage difference between the control input voltage and an input voltage at the input node is substantially constant during the on condition, wherein the constant voltage difference circuit includes a plurality of transistors, and wherein the constant voltage difference circuit is arranged such that the substantially constant voltage difference is substantially equal to the sum of the gate-to-source voltages of each of the plurality of transistors.

2. A transmission gate, comprising:
    a switch circuit including an input that is coupled to an input node, an output that is coupled to an output node, and a control input that is coupled to a control input node;
    a boost circuit that is arranged to provide a boost voltage at a boost node responsive to a supply voltage;
    a current source circuit that is coupled between the boost node and the control input node, wherein the current source circuit is arranged to provide a bias current during an on condition, and wherein the on condition is an on condition for the switch circuit; and
    a constant voltage difference circuit that is coupled to the control input node, wherein the constant voltage difference circuit is arranged to provide a control input voltage at the control input node such that a voltage difference between the control input voltage and an input voltage at the input node is substantially constant during the on condition, wherein:
    the boost circuit is a charge pump circuit that is arranged to provide the boost voltage such that the boost voltage is greater than the supply voltage; and
    wherein the current source circuit is a current mirror circuit that is arranged to provide the bias current such that the bias current is substantially constant.

3. The transmission gate of claim 2, wherein the constant voltage difference circuit is arranged to provide the control input voltage such that the control input voltage tracks the input voltage such that the voltage difference between the control input voltage and the input voltage is substantially constant, but such that the voltage difference varies slightly over temperature and process.

4. The transmission gate of claim 3, wherein the constant voltage difference circuit is arranged to provide the control input voltage such that the voltage difference between the control input voltage and the input voltage varies over temperature and process such that an on-resistance of the switch circuit between the input node and the output node is substantially constant over temperature and process.

5. A transmission gate, comprising:
    a switch circuit including an input that is coupled to an input node, an output that is coupled to an output node, and a control input that is coupled to a control input node;
    a boost circuit that is arranged to provide a boost voltage at a boost node responsive to a supply voltage;
    a current source circuit that is coupled between the boost node and the control input node, wherein the current source circuit is arranged to provide a bias current during an on condition, and wherein the on condition is an on condition for the switch circuit; and
    a constant voltage difference circuit that is coupled to the control input node, wherein the constant voltage difference circuit is arranged to provide a control input voltage at the control input node such that a voltage difference between the control input voltage and an input voltage at the input node is substantially constant during the on condition, wherein the constant voltage difference circuit includes:
    a first transistor that is coupled between the control input node and another node, wherein the first transistor is arranged in a diode configuration; and
    a second transistor including a gate that is coupled to the input node, a source that is coupled to the other node, and a drain.

6. The transmission gate of claim 5 wherein the current source circuit, the first transistor, and the second transistor are coupled in series.

7. The transmission gate of claim 5, wherein the first and second transistors are both p-type transistors.

8. The transmission gate of claim 5, wherein the switch circuit is a third transistor, the first transistor is an n-type transistor, the second transistor is a p-type transistor, the third transistor is an n-type transistor, and wherein the first transistor substantially matches the third transistor.

9. The transmission gate of claim 5, wherein the switch circuit is a third transistor, the input of the switch circuit is a source of the third transistor, the output of the switch circuit is a drain of the third transistor, the control input of the switch circuit is a gate of the third transistor, and wherein the first, second, and third transistors are sized sufficiently small that signals having a frequency of at least 1.5 GHz are capable of being transmitted from the input node to the output node during the on condition.

10. A circuit for multiplexing, comprising:
a first transmission gate, including:
  a switch circuit including an input that is coupled to an input node, an output that is coupled to an output node, and a control input that is coupled to a control input node;
  a constant voltage difference circuit that is coupled to the control input node, wherein the constant voltage difference circuit is arranged to provide a control input voltage at the control input node such that a voltage difference between the control input voltage and an input voltage at the input node is substantially constant during an on condition of the first transmission gate, and wherein the constant voltage difference circuit includes at least one of a first transistor or a first diode; and
a second switch circuit including an input that is coupled to the input node, an output that is coupled to a second output node, and a control input that is coupled to a control input node.

11. A circuit for multiplexing, comprising:
a first transmission gate, including:
  a switch circuit including an input that is coupled to an input node, an output that is coupled to an output node, and a control input that is coupled to a control input node;
  a constant voltage difference circuit that is coupled to the control input node, wherein the constant voltage difference circuit is arranged to provide a control input voltage at the control input node such that a voltage difference between the control input voltage and an input voltage at the input node is substantially constant during an on condition of the first transmission gate, and wherein the constant voltage difference circuit includes at least one of a first transistor or a first diode; and
a second transmission gate, including:
  a second switch circuit including an input that is coupled to a second input node, an output that is coupled to the output node, and a control input that is coupled to a second control input node; and
  a second constant voltage difference circuit that is coupled to the second control input node, wherein the second constant voltage difference circuit is arranged to provide a second control input voltage at the second control input node such that a voltage difference between the second control input voltage and a second input voltage at the second input node is substantially constant during an on condition of the second transmission gate.

12. The circuit of claim 11, wherein the second input voltage is a calibration voltage, the on condition of the second transmission gate occurs during a calibration phase, and an on condition of the first transmission gate occurs during a normal operation.

13. The circuit of claim 12, wherein:
the first transmission gate further includes:
  a boost circuit that is arranged to provide a boost voltage at a boost node responsive to a supply voltage, such that the boost voltage is greater than the supply voltage;
  a current source circuit that is coupled between the boost node and the control input node, wherein the current source circuit is arranged to provide a bias current that is substantially constant during the on condition of the first transmission gate;
the constant voltage difference circuit includes:
  a first transistor that is coupled between the control input node and another node, wherein the first transistor is arranged in a diode configuration; and
  a second transistor including a gate that is coupled to the input node, a source that is coupled to the other node, and a drain;
the switch circuit is a third transistor;
the input of the switch circuit is a source of the third transistor;
the output of the switch circuit is a drain of the third transistor; and
wherein the control input of the switch circuit is a gate of the third transistor.

14. The transmission gate of claim 5, wherein the switch circuit is a transistor, the input of the switch circuit is a source of the transistor, the output of the switch circuit is a drain of the transistor, the control input of the switch circuit is a gate of the transistor, and wherein the voltage difference between the control input voltage and the input voltage is the gate-to-source voltage of the transistor.

15. A transmission gate, comprising:
a switch circuit including an input that is coupled to an input node, an output that is coupled to an output node, and a control input that is coupled to a control input node;
a boost circuit that is arranged to provide a boost voltage at a boost node responsive to a supply voltage, wherein the boost circuit is arranged to provide the boost voltage such that the boost voltage is greater than the supply voltage even if an input voltage at the input node is zero;
a current source circuit that is coupled between the boost node and the control input node, wherein the current source circuit is arranged to provide a bias current during an on condition, and wherein the on condition is an on condition for the switch circuit; and
a constant voltage difference circuit that is coupled to the control input node, wherein the constant voltage difference circuit is arranged to provide a control input voltage at the control input node such that a voltage difference between the control input voltage and the input voltage is substantially constant during the on condition.

16. A transmission gate, comprising:
a switch circuit including an input that is coupled to an input node, an output that is coupled to an output node, and a control input that is coupled to a control input node;
a boost circuit that is arranged to provide a boost voltage at a boost node responsive to a supply voltage;
a current source circuit that is coupled between the boost node and the control input node, wherein the current source circuit is arranged to provide a bias current during an on condition, the on condition is an on condition for the switch circuit, and wherein the current source circuit includes a current mirror; and
a constant voltage difference circuit that is coupled to the control input node, wherein the constant voltage difference circuit is arranged to provide a control input voltage at the control input node such that a voltage difference between the control input voltage and an input voltage at the input node is substantially constant during the on condition.

17. A transmission gate, comprising:
a switch circuit including an input that is coupled to an input node, an output that is coupled to an output node, and a control input that is coupled to a control input node;
a boost circuit that is arranged to provide a boost voltage at a boost node responsive to a supply voltage;
a current source circuit that is coupled between the boost node and the control input node, wherein the current source circuit is arranged to provide a bias current during an on condition, and wherein the on condition is an on condition for the switch circuit; and
a constant voltage difference circuit that is coupled to the control input node, wherein the constant voltage difference circuit is arranged to provide a control input voltage at the control input node such that a voltage difference between the control input voltage and an input voltage at the input node is substantially constant during the on condition; the constant voltage difference circuit includes a first component and a second component; the first component includes at least one of a transistor or a diode, the second component includes at least one of a transistor or a diode; and wherein the current source circuit, the first component, and the second component are coupled in series.

18. A method for multiplexing, comprising:
receiving an input voltage at an input node;
during an off condition, substantially de-coupling an output node from the input node;
providing a boost voltage; and
during an on condition for a switch circuit that is coupled between the input node and the output node:
providing a bias current responsive to the boost voltage; and
coupling the input signal to the output node by:
responsive to the bias current, providing a control input signal such that a voltage difference between the control input voltage and the input voltage is substantially constant; and
providing the control input signal to a control input of the switch circuit, wherein maintaining the substantially constant voltage difference between the control input voltage and the input voltage is not accomplished via capacitive sampling.

19. A method for multiplexing, comprising:
receiving an input voltage at an input node;
during an off condition, substantially de-coupling an output node from the input node;
providing a boost voltage; and
during an on condition for a switch circuit that is coupled between the input node and the output node:
providing a bias current responsive to the boost voltage; and
coupling the input signal to the output node by:
responsive to the bias current, providing a control input signal such that a voltage difference between the control input voltage and the input voltage is substantially constant; and
providing the control input signal to a control input of the switch circuit, wherein providing the control input signal includes:
receiving the bias current at a control input node, wherein the control input of the switch circuit is coupled to the control input node;
employing a first gate-to-source voltage to provide a voltage drop between the control input node and another node; and
employing a second gate-to-source voltage to provide a voltage drop between the other node and the input node.

* * * * *